(12) United States Patent
Pickett et al.

(10) Patent No.: US 10,062,568 B2
(45) Date of Patent: Aug. 28, 2018

(54) CHEMICAL VAPOR DEPOSITION METHOD FOR FABRICATING TWO-DIMENSIONAL MATERIALS

(71) Applicant: NANOCO TECHNOLOGIES, LTD., Manchester (GB)

(72) Inventors: Nigel Pickett, Manchester (GB); Ombretta Masala, Manchester (GB); Nicky Prabhudas Savjani, Manchester (GB)

(73) Assignee: Nanoco Technologies, Ltd., Manchester (GB)

( * ) Notice: Subject to any disclaimer, the term of this patent is extended or adjusted under 35 U.S.C. 154(b) by 0 days.

(21) Appl. No.: 15/587,551

(22) Filed: May 5, 2017

(65) Prior Publication Data

US 2017/0330748 A1 Nov. 16, 2017

Related U.S. Application Data

(60) Provisional application No. 62/336,228, filed on May 13, 2016.

(51) Int. Cl.
| | | |
|---|---|---|
| H01L 21/02 | (2006.01) | |
| C30B 29/46 | (2006.01) | |
| C23C 16/30 | (2006.01) | |
| C23C 16/46 | (2006.01) | |
| C30B 29/60 | (2006.01) | |

(52) U.S. Cl.
CPC ...... *H01L 21/02568* (2013.01); *C23C 16/305* (2013.01); *C23C 16/46* (2013.01); *C30B 29/46* (2013.01); *C30B 29/60* (2013.01); *H01L 21/0262* (2013.01)

(58) Field of Classification Search
None
See application file for complete search history.

(56) References Cited

U.S. PATENT DOCUMENTS

| | | | |
|---|---|---|---|
| 9,783,563 B2 * | 10/2017 | Pore | C23C 16/306 |
| 2014/0027775 A1 | 1/2014 | Quick et al. | |
| 2014/0299772 A1 * | 10/2014 | Guyot-Sionnest | H01L 31/09 250/338.4 |
| 2015/0118487 A1 * | 4/2015 | Wolden | C01G 49/12 428/336 |
| 2016/0122868 A1 | 5/2016 | Kim et al. | |

OTHER PUBLICATIONS

Boscher, N.D., et al., "Atmospheric Pressure Chemical Vapor Deposition of WSe 2 Thin Films on Glass-Highly Hydrophobic Sticky Surfaces", Journal of Materials Chemistry, Nov. 16, 2005, vol. 16, No. 1, pp. 122-127.

(Continued)

*Primary Examiner* — Angel Roman
(74) *Attorney, Agent, or Firm* — Blank Rome, LLP

(57) ABSTRACT

A method of synthesis of two-dimensional metal chalcogenide monolayers, such as $WSe_2$ and $MoSe_2$, is based on a chemical vapor deposition approach that uses $H_2Se$ or alkyl or aryl selenide precursors to form a reactive gas. The gaseous selenium precursor may be introduced into a tube furnace containing a metal precursor at a selected temperature, wherein the selenium and metal precursors react to form metal chalcogenide monolayers.

18 Claims, 3 Drawing Sheets

(56) References Cited

OTHER PUBLICATIONS

Chang, Yung-Huang, et al., "Monolayer MoSe2 Grown by Chemical Vapor Deposition for Fast Photodetection", ACS NANO, (2014), vol. 8, No. 8, pp. 8582-8590.
Wang, Xingli, et al., "Chemical Vapor Deposition Growth of Crystalline Monolayer MoSe2", ACS NANO, (2014), vol. 8, No. 5, pp. 5125-5131.
Shim, Gi Woong, et at., "Large-Area Single-Layer MoSe2 and Its van der Waals Heterostructures", ACS NANO, (2014), vol. 8, No. 7, pp. 6655-6662.
Boscher, N.D., et al., "Atmospheric Pressure CVD of Molybdenum Diselenide Films on Glass", Chemical Vapor Deposition, Nov. 16, 2006, vol. 12, pp. 692-698.
Boscher, N.D., et al., "Atmospheric Pressure Chemical Vapour Deposition of NbSe2—TiSe2 Composite Thin Films", Applied Surface Science, Dec. 4, 2009, vol. 256, No. 10, pp. 3178-3182.
Boscher, N.D., et al., "Atmospheric Pressure CVD of TiSe2 Thin Films on Glass", Chemical Vapor Deposition, Jan. 19, 2006, vol. 12, No. 1, pp. 54-58.
Boscher et al., "Atmospheric Pressure Chemical Vapour Deposition of Vanadium Diselenide Thin Films", Applied Surface Science, Dec. 14, 2006, vol. 253, No. 14, pp. 6041-6046.
Giani, A., et al., "Elaboration of Bi2Se3 by Metalorganic Chemical Vapour Deposition", Journal of Crystal Growth, (2001), vol. 236, No. 1-3, pp. 217-220.
Reso, D., et al., "Hot Wire Chemical Vapor Deposition of Germanium Selenide Thin Films for Nonvolatile Random Access Memory Applications", Applied Physics Letters, Apr. 11, 2011, vol. 98, No. 1, pp. 151901-151901-3.
Pore, Viljami, et al., "Atomic Layer Deposition of Metal Tellurides and Selenides Using Alkylsilyl Compounds of Tellurium and Selenium" Journal of the American Chemical Society, Jan. 5, 2009, vol. 131, No. 10, pp. 3478-3480.
Chhowalla, Manish, et al., "The Chemistry of Two-Dimensional Layered Transition Metals Dichalcogenide Nanosheets", Nature Chemistry, Mar. 20, 2013, vol. 5, No. 4, pp. 263-275.
Hofmann, W. K., (1988), "Thin Films of Molybdenum and Tungsten Disulphides by Metal Organic Chemical Vapour Deposition", Journal of Materials Science, 23, pp. 3981-3986.
Bosi, M., (2015), "Growth and Synthesis of Mono and Few-Layers Transition Metal Dichalcogenides by Vapour Techniques: A Review", RSC Advances 5, 75500.
Gong, Y., et al., (2015), "Tellurium-Assisted Low-Temperature Synthesis of MoS2 and WS2 Monolayers", ACS Nano, vol. 9, No. 12, pp. 11658-11666.
Clark, G., et al., (2014), "Vapor-Transport Growth of High Optical Quality WSe2 Monolayersa", APL Materials 2, 101101.
Prabakaran, A., et al., (2014), "WS2 2D Nanosheets in 3D Nanoflowers", Chem. Commun., 50, pp. 12360-12362.
Eichfeld, S.M., et al. (2015), "Highly Scalable, Atomically Thin WSe2 Grown via Metal-Organic Chemical Vapor Depostion", ACSNano, vol. 9, No. 2, pp. 2080-2087.
Zou, M, et al., (2015), "WSe2 and W(SexS1__x)2 Nanoflakes Grown on Carbon Nanofibers for the Electrocatalytic Hydrogen Evolutiono Reaction", J. Mater., Chem. A, 3, 18090.
Kumar, V.K., et al., (2015), "A Predictive Approach to CVD of Crystalline Layers of TMDs: The Case of MoS2", Nanocscale, 7,pp. 7802-7810.
Liu, K.-K., et al., (2012), "Growth of Large-Area and Highly Crystalline MoS2, Thin Layers on Insulating Substrates", Nano Lett. 12, pp. 1538-1544.
Mann, J., et al., (2013), "Facile Growth of Monolayer MoS2 Film Areas on SiO2", The European Physical Journal B, 86, 226.
Jeon, J., et al., (2016), "Size-Tunable Synthesis of Monolayer MoS2 Nanoparticles and Their Applicationss in Non-Volatile Memory Devices", Nanoscale 8, pp. 16995-17003.
Shaw, J.C., et al., (2014), "Chemical Vapor Deposition Growth of Monolayer MoSe2 Nanosheets", Nano Research 7(4), pp. 511-517.

* cited by examiner

CHEMICAL VAPOR DEPOSITION METHOD FOR FABRICATING TWO-DIMENSIONAL MATERIALS

CROSS-REFERENCE TO RELATED APPLICATIONS

This application claims the benefit of U.S. Provisional Application Ser. No. 62/336,228, filed May 13, 2016, the contents of which are hereby incorporated by reference in their entirety.

STATEMENT REGARDING FEDERALLY SPONSORED RESEARCH OR DEVELOPMENT

Not Applicable

BACKGROUND OF THE INVENTION

1. Field of the Invention

The present invention generally relates to the synthesis of two-dimensional metal chalcogenide materials. More particularly, it relates to chemical vapor deposition (CVD) methods for fabricating such 2-D materials.

2. Description of the Related Art Including Information Disclosed Under 37 CFR 1.97 and 1.98

Two-dimensional (2-D) nanosheets of transition metal dichalcogenide (TMDC) materials are of increasing interest for applications ranging from catalysis to sensing, energy storage and optoelectronic devices. Mono- and few-layered TMDCs are direct band gap semiconductors, with variation in band gap and carrier type (n- or p-type) depending on composition, structure and dimensionality.

Of the 2-D TMDCs, the semiconductors $WSe_2$ and $MoS_2$ are of particular interest because, while largely preserving their bulk properties, additional properties arise due to quantum confinement effects when the dimensions of the materials are reduced to mono- or few layers. In the case of $WSe_2$ and $MoS_2$, these include the exhibition of an indirect to direct band gap transition, with strong excitonic effects, when the thickness is reduced to a single monolayer. This leads to strong enhancement in the photoluminescence efficiency, opening up new opportunities for their application in optoelectronic devices. Other materials of interest include $WS_2$ and $MoSe_2$.

Group 4 to 7 TMDCs predominantly crystallise in layered structures, leading to anisotropy in their electrical, chemical, mechanical and thermal properties. Each layer comprises a hexagonally packed layer of metal atoms sandwiched between two layers of chalcogen atoms via covalent bonds. Neighbouring layers are weakly bound by van der Waals interactions, which may easily be broken by mechanical or chemical methods to create mono- and few-layer structures.

Mono- and few-layer TMDCs may be produced using "top-down" and "bottom-up" approaches. Top-down approaches involve the removal of layers, either mechanically or chemically, from the bulk material. Such techniques include mechanical exfoliation, ultrasound-assisted liquid phase exfoliation (LPE), and intercalation techniques. Bottom-up approaches, whereby TMDC layers are grown from their constituent elements, include chemical vapor deposition (CVD), atomic layer deposition (ALD), and molecular beam epitaxy (MBE), as well as solution-based approaches including hot-injection.

CVD growth of TMDCs dates back to 1988, when Hofmann demonstrated metal organic chemical vapor deposition (MOCVD) growth of $MoS_2$ and $WS_2$ on various substrates. [W. K. Hofmann, *J. Mater. Sci.*, 1988, 23, 3981] Large-area scalability, uniformity and thickness control are routinely achieved for semiconductor thin films deposited by this technique and they have recently been extended to the growth of graphene and TMDC monolayers. [M. Bosi, *RSC Adv.*, 2015, 5, 75500]

In a typical CVD set-up, a substrate (usually $SiO_2/Si$) is coated with a thin layer of transition metal (e.g. Mo foil) or metal oxide (e.g. $MoO_3$ and $WO_3$) and then exposed to a chalcogen atmosphere. The chalcogenide atmosphere may be generated, for example, by using low-melting chalcogenide powders (e.g. S or Se powder).

In the CVD reactor the chalcogenide powder is placed inside the reactor upstream to the substrate and the metal precursor under an inert atmosphere. The furnace is heated at a certain temperature, depending on the nature of the precursor, to facilitate the sublimation. As the chalcogenide powder starts to sublime, the vapors are transported by the carrier gas towards the metal precursor and the substrate where the growth of the monolayers takes place.

More recent approaches use solid metal precursors. In these cases, the metal precursor may be either scattered on a substrate that is located in the furnace downstream with respect to the chalcogenide powder or loaded directly on the heating tube between the bare substrate and the chalcogenide powder, with the bare substrate being located downstream.

The possibility of using a solid metal precursor has opened up the method to a wide range of materials including metal halides and carbonyls. In the case of $WSe_2$, nanosheet growth by CVD has been demonstrated from W metal, [Y. Gong, Z. Lin, G. Ye, G. Shi, S. Feng, Y. Lei, A. L. Elias, N. Perea-Lopez, R. Vajtai, H. Terrones, Z. Liu, M. Terrones and P. M. Ajayan, *ACS Nano*, 2015, 9, 11658] $WSe_2$ and $WS_2$ bulk powders, [G. Clark, S. Wu, P. Rivera, J. Finney, P. Nguyen, D. Cobden and X. Xu, *APL Mater.*, 2014, 2, 101101] halides: $WCl_n$ (n=4, 5, 6); $WO_2Cl_2$; and $WF_6$, [A. Prabakaran, F. Dillon, J. Melbourne, L. Jones, R. J. Nicholls, P. Holdway, J. Britton, A. S. Koos, A. Crossley, P. D. Nellist and N. Grobert, *Chem. Commun.*, 2014, 50, 12360] ammonium salts: $(NH_4)_6H_2W_{12}O_{40}$; and $(NH_4)_2WS_4$, [M. L. Zou, J. D. Chen, L. F. Xiao, H. Zhu, T. T. Yang, M. Zhong and M. L. Du, *J. Mater. Chem. A*, 2015, 3, 18090] and the organic precursor $W(CO)_6$. [S. M. Eichfield, L. Hossain, Y.-C. Lin, A. F. Piasecki, B. Kupp, A. G. Birdwell, R. A. Burke, N. Lu, X. Peng, J. Li, A. Azcatl, S. McDonnell, R. M. Wallace, M. J. Kim, T. S. Mayer, J. M. Redwing and J. A. Robinson, *ACS Nano*, 2015, 9, 2080] Similar precursors have been used for the synthesis of $MoS_2$ and $MoSe_2$. [V. Kranthi Kumar, S. Dhar, T. H. Choudhury, S. A. Shivashankar and S. Raghavan, *Nanoscale*, 2015, 7, 7802; J. Mann, D. Sun, Q. Ma, J.-R. Chen, E. Preciado, T. Ohta, B. Diaconescu, K. Yamaguchi, T. Tran, M. Wurch, K. M. Magnone, T. F. Heinz, G. L. Kellogg, R. Kavakami and L. Bartels, *Eur. Phys. J. B*, 2013, 86, 226; K.-K. Liu, W. Zhong, Y.-H. Lee, Y.-C. Lin, M.-T. Chang, C.-Y. Su, C.-S. Chang, H. Li, Y. Shi, H. Zhang, C.-S. Lai and L.-J. Li, *Nano Lett.*, 2012, 12, 1538]

The development in the CVD growth of 2-D materials has thrived in recent years, however the synthesis of larger single crystal 2-D materials with a quality comparable to those produced by mechanical exfoliation is still a big challenge. In addition, the obtained single crystal TMDC flakes or domains achieved so far are relatively small compared to the single crystal graphene flakes. Full control over the CVD growth process is critical. In the CVD method based on chalcogenide powders, the concentration and partial pressure of reactive chalcogenide species are difficult to control reproducibly to achieve and maintain uniform growth conditions and strongly depend on the geometry of the system. Often full substrate coverage is difficult to achieve and this problem is exacerbated for the growth of monolayers on larger substrates.

The method can be very wasteful because only part of the chalcogenide reacts to form the desired product and large amounts of unreacted chalcogenide may deposit on the cooler regions of the reactor. This also requires thorough cleaning and scrubbing of the reactor between runs to avoid contamination from a previous synthesis.

Prior art methods exploit the vaporization of elemental selenium powder to selenize suitable metal precursors at high temperatures. Uniform vaporization of selenium powder is crucial for obtaining uniform nucleation and growth but it is difficult to achieve over large areas.

Metal oxides are typical source materials for the CVD growth of 2-D materials and they require high temperatures to sublime due to their high boiling point and vapor pressure (for example $WO_3$ has a boiling point >1,700° C.). This high temperature poses strong limitations on the choice of substrates available for the growth, for example lower temperature conditions are desirable to enable the use of flexible substrates and the compatibility with other lower-temperature industrial fabrication technologies.

Another limitation is that although CVD systems with different heating zones exist, the majority of the reported methods rely on all the precursors being loaded together in the furnace, heated at the same time and with the same temperature ramp rate, making it unfeasible to introduce the chalcogenide vapors later at a second stage during the process, resulting in limited versatility.

Selenium powder is not a very reactive precursor as evidenced by the fact that $WSe_2$ is a relatively more difficult material to synthesize than $MoS_2$, for example, due to the fact the selenium precursor is less reactive than the sulphur precursor.

There have been a few reports of single- and few-layer Group 13 and Group 14 layered compounds, such as GaSe, GeSe and SnSe. Though the 2-D properties of these materials are largely unknown, the wide variety of optical and electrical properties of their bulk counterparts suggests that they may exhibit distinct properties of interest in the 2-D form.

Thus, there is a need to develop a more versatile method of synthesis of TMDC and other metal chalcogenide nanostructures that offers compositional uniformity over a large area.

BRIEF SUMMARY OF THE INVENTION

Herein, a method of synthesis of metal chalcogenide monolayers, such as TMDC monolayers, for example, $WSe_2$ and $MoSe_2$, is described. The method is based on a CVD approach, using $H_2Se$ or alkyl or aryl selenide precursors to form the reactive gas. The gaseous selenium precursor is introduced into a tube furnace containing a metal precursor at a given temperature, where the selenium and metal precursors react to form metal chalcogenide monolayers.

In one embodiment, the gaseous selenium precursor is used in combination with other gases to create a gradient composition or doped metal chalcogenide monolayer.

In a further embodiment, the gaseous selenium precursor is mixed with a ligand with a low boiling point, such as a thiol or selenol, capable of coordinating the atoms and influencing the growth of the metal chalcogenide monolayer.

In one embodiment, the reaction proceeds at a temperature, or range of temperatures, below the softening point of glass.

In one embodiment, the reaction proceeds at a reduced pressure. In another embodiment, the reaction proceeds at atmospheric pressure. In a further embodiment, the reaction proceeds at a slight overpressure.

The lateral dimensions of the nanosheets may be tuned from a few nanometers to greater than 100 μm.

BRIEF DESCRIPTION OF THE SEVERAL VIEWS OF THE DRAWING(S)

DETAILED DESCRIPTION OF THE INVENTION

Figure 1:
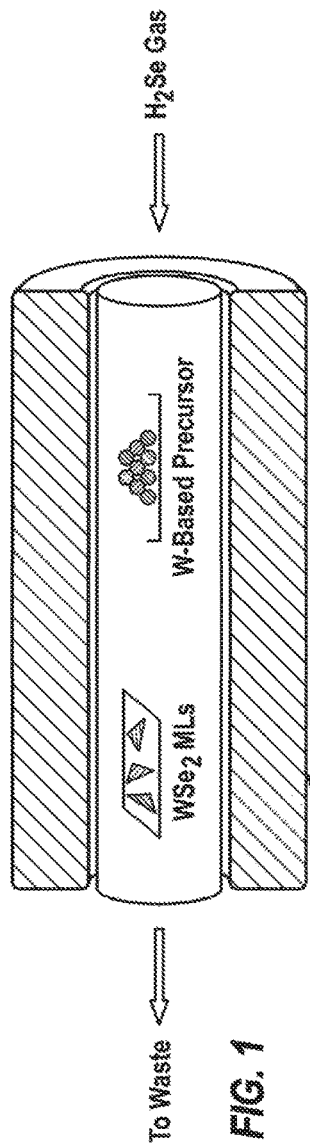
FIG. 1 is a schematic diagram illustrating the synthesis of $WSe_2$ monolayers using $H_2Se$ gas according to an embodiment of the invention.

Herein, a method of synthesis of metal chalcogenide monolayers, for example, TMDC monolayers such as $WSe_2$ and $MoSe_2$, is described. The method is based on a CVD approach, using $H_2Se$ or alkyl or aryl selenide precursors to form the reactive gas. The process is illustrated for the synthesis of $WSe_2$ monolayers using $H_2Se$ gas in FIG. 1. The gaseous selenium precursor is introduced into a tube furnace containing a metal precursor at a given temperature, where the selenium and metal precursors react to form metal chalcogenide monolayers.

The method may be used to synthesize TMDC monolayers including, but not restricted to: $WSe_2$; $MoSe_2$; $NbSe_2$; $PtSe_2$; $ReSe_2$; $TaSe_2$; $TiSe_2$; $ZrSe_2$; $ScSe_2$; and $VSe_2$, and including alloys and doped derivatives thereof. Further, the method may be used to synthesize other metal selenide monolayers including, but not restricted to: GaSe; $Ga_2Se_3$; $Bi_2Se_3$; GeSe; InSe; $In_2Se_3$; $SnSe_2$; SnSe; $SbSe_3$; $ZrSe_3$; $MnIn_2Se_4$; $MgIn_2Se_4$; $Pb_2Bi_2Se_5$; $SnPSe_3$; and PdPSe, and including alloys and doped derivatives thereof.

The metal precursor may include, but is not restricted to: a metal, such as W or Mo; a metal diselenide bulk powder, e.g. $WSe_2$, or $MoSe_2$; a metal oxide, e.g. $WO_3$ or $MoO_3$; inorganic precursors, e.g. $WCl_n$ (n=4-6), $Mo_6Cl_{12}$, $MoCl_3$, $[MoCl_5]_2$, $WO_2Cl_2$, $MoO_2Cl_2$, $WF_6$, $MoF_6$, $(NH_4)_6H_2W_{12}O_{40}$ or $(NH_4)_6H_2Mo_{12}O_{40}$; and organometallic precursors such as carbonyl salts, e.g. $Mo(CO)_6$ or $W(CO)_6$ and their alkyl and aryl derivatives; metal alkyl precursors, e.g. $W(CH_3)_6$; ethylhexanoate salts, e.g. $Mo[OOCH(C_2H_5)C_4H_9]x$; or bis(ethylbenzene)molybdenum $[(C_2H_5)_yC_6H_{6-y}]_2Mo$ (y=1-4).

In one embodiment, the gaseous selenium precursor is $H_2Se$. $H_2Se$ acts not only as a reactive selenium source but also as a carrier gas. In one embodiment, $H_2Se$ is mixed with other gases, for example $H_2$, to promote a strongly reducing atmosphere and control the oxidation state of the metal. In the case of $WF_6$ as a metal precursor, a reduction of the W atom from the +VI oxidation state in $WF_6$ to the +IV oxidation state in $WSe_2$ is required. $H_2Se$ itself has strong reducing character; in an alternative embodiment $H_2Se$ facilitates the reduction of the metal precursor from the +VI oxidation state to the +IV oxidation state in $WSe_2$ or $MoSe_2$ without the need for an additional reducing agent. The high reactivity of $H_2Se$ compared to elemental selenium may favor better crystallinity and sheet growth.

In another embodiment, the gaseous selenium precursor is a selenium compound with low volatility, such as an alkyl or aryl selenide. Examples include, but are not restricted to: di-tert-butyl selenide, $Se(C(CH_3)_3)_2$; dimethyl selenide, $(C_2H_5)_2Se$; diphenyl selenide, $Ph_2Se$; and diphenyl diselenide, $Ph_2Se_2$. The aforementioned precursors are particularly suitable as they have low boiling points, i.e. around or below 100° C. Low-volatility alkyl and aryl diselenides decompose at low temperature and with a clean decomposition pathway that yields only gaseous by-products.

In a further embodiment, the gaseous selenium precursor is used in combination with other gases, such as, but not restricted to, $H_2S$, to create a gradient composition. This enables modulation of the band gap of the 2-D metal chalcogenide material to form, for example, $WS_xSe_{2-x}$, $MoS_xSe_{2-x}$, $GaS_xSe_{1-x}$, $GeS_xSe_{1-x}$, $SnS_xSe_{2-x}$, and $Zr(S_xSe_{1-x})_3$. Gas mixtures may also be used to form doped metal chalcogenide materials. Doping may alter the electronic properties of the metal chalcogenide material, which may lead to, for example, improved photoluminescence quantum yield.

In a further embodiment, the gaseous selenium precursor is mixed with a ligand having a low boiling point, such as a thiol or selenol, capable of coordinating the atoms and influencing the growth of the metal chalcogenide monolayer. This may provide both a pathway to doping and also favor a uniform size distribution and tailored sheet growth. Suitable ligands include, but are not restricted to: alkane thiols, e.g. 1-octane thiol or 1-dodecane thiol; alkane selenols, e.g. 1-octane selenol or 1-dodecane selenol; and combinations thereof.

The gaseous selenium precursors herein described have low decomposition temperatures, below the softening point of glass (600° C.), enabling the use of glass reactors that are significantly less expensive than the quartz reactors required for CVD growth at temperatures above 600° C. In addition, a lower reaction temperature allows monolayer growth on flexible substrates, such as low-cost, thermally sensitive polymer substrates that would otherwise warp, melt or degrade at the high temperatures employed for CVD growth of TMDC monolayers in the prior art.

In one embodiment, the gaseous selenium precursor is introduced into the tube furnace at room temperature, then the temperature is ramped up systematically from room temperature to a temperature to induce growth of the metal chalcogenide monolayers. In an alternative embodiment, the gaseous selenium precursor is introduced into the tube furnace at elevated temperature. This may prevent any side-reactions when heating the furnace. It will be obvious to one of ordinary skill in the art that the reaction temperature, or range of temperatures, will depend on the choice of precursors. In one embodiment, the reaction proceeds at a temperature, or a range of temperatures, below the softening point of glass. For example, the reaction may proceed at temperatures in the region of 100° C. to 550° C. In another embodiment, the reaction proceeds at a temperature, or range of temperatures, above 550° C.

In one particular embodiment, the gaseous selenium precursor is used neat. In another embodiment, the gaseous selenium precursor is mixed with an inert carrier gas, such as, but not restricted to, $N_2$ or Ar. In one embodiment, the supply of the gaseous selenium precursor is controlled during the growth process to create concentration gradients. For example, when using $H_2Se$, a fast gas-exchange step may be introduced, whereby the flow of $H_2Se$ into the furnace may be rapidly stopped at any point during the process by a combination of an increased inert gas purge and pumping capacity and replaced by an inert gas, such as $N_2$ or Ar.

The flow rate of any gaseous precursor(s) and/or carrier gas(es) may be controlled, for example, using a mass flow controller. One of ordinary skill in the art will recognize that the required flow rate or any precursor(s) and/or carrier gas(es) depends on the how far down the reactor the precursor vapors are required to travel. The required flow rates are also related to the diameter of the reaction tube; with increasing diameter, a higher flow rate is required to achieve the same vapor flow down the tube.

The pressure of the reaction chamber may be used to assist in controlling nucleation, and the thickness of the nanosheets. In one embodiment, the reaction is conducted at a reduced pressure, for example, below atmospheric pressure down to approximately 2 mbar. In another embodiment, the reaction is conducted at atmospheric pressure. In yet another embodiment, the reaction is conducted at a slight overpressure, for example, greater than atmospheric pressure up to approximately 1.2 bar.

The metal chalcogenide monolayers described herein may be used for a wide range of applications including, but not restricted to: optoelectronic devices, e.g. photodiodes, phototransistors, photodetectors, photovoltaics, light-emitting diodes, laser diodes; memory devices; field-effect transistors; inverters; logic gates; sensors; catalysis; fuel cells; batteries; plasmonic devices; photoluminescence applications, e.g. displays, lighting, optical barcoding, anti-counterfeiting; electroluminescence applications, e.g. displays, lighting; and biological applications, e.g. bioimaging, biosensing, photothermal therapy, photodynamic therapy, antibacterial activity, drug delivery.

By careful tuning of the reaction conditions, the lateral dimensions of the metal chalcogenide monolayers may be controlled. For example, in the prior art $H_2$ has been introduced into the CVD reaction chamber to inhibit the lateral growth of $MoS_2$ nanosheets formed from $MoO_3$ and sulphur powder. [J. Jeon, J. Lee, G. Yoo, H.-H. Park, G. Y. Yeom, Y. H. Jang and S. Lee, *Nanoscale*, 2016, 8, 16995] In one embodiment, the gaseous selenium precursor is mixed with a reducing gas such as, but not restricted to, $H_2$. In a further embodiment, the gaseous selenium precursor is mixed with a reducing gas and an inert carrier gas. The ratio of the reducing gas to the gaseous selenium precursor and/or the inert carrier gas may be varied to tune the lateral dimensions of the metal chalcogenide monolayers. One of ordinary skill in the art will recognize that the lateral dimensions of the metal chalcogenide monolayers may also be manipulated by varying reaction parameters such as, but not restricted to, temperature, pressure, time, gaseous precursor flow rate(s), and choice of precursor(s).

In some embodiments, the lateral dimensions of the metal chalcogenide monolayers are greater than 100 μm. "Large" (>100 μm) nanosheets may be advantageous for the growth of numerous electronic circuits on a single nanosheet. In further embodiments, the lateral dimensions of the metal chalcogenide monolayers are between 10 μm to 100 μm ("medium-sized" nanosheets). Medium-sized nanosheets are suitable for a range of electronics applications. In yet further embodiments, the lateral dimensions of the metal chalcogenide monolayers are less than 10 μm ("small" nanosheets). More particularly, the lateral dimensions of the metal chalcogenide monolayers may be in the quantum confinement regime, wherein the optical, electronic and chemical properties of the nanosheets may be manipulated by changing their lateral dimensions. For example, metal chalcogenide monolayer nanosheets of materials such as $MoSe_2$ and $WSe_2$ with lateral dimensions of approximately 10 nm or less may display properties such as size-tunable emission when excited by an energy source such as electricity or light. These size-tunable emission properties are particularly advantageous for applications such as displays, lighting, optical barcoding, anti-counterfeiting and biological imaging. Further, small nanosheets with a hydrodynamic diameter less than the glomerular filtration threshold of the kidneys are particularly suited to in vivo biological applications as they may be readily excreted via the kidneys.

Example: Synthesis of $MoSe_2$ Nanosheets

Figure 2:
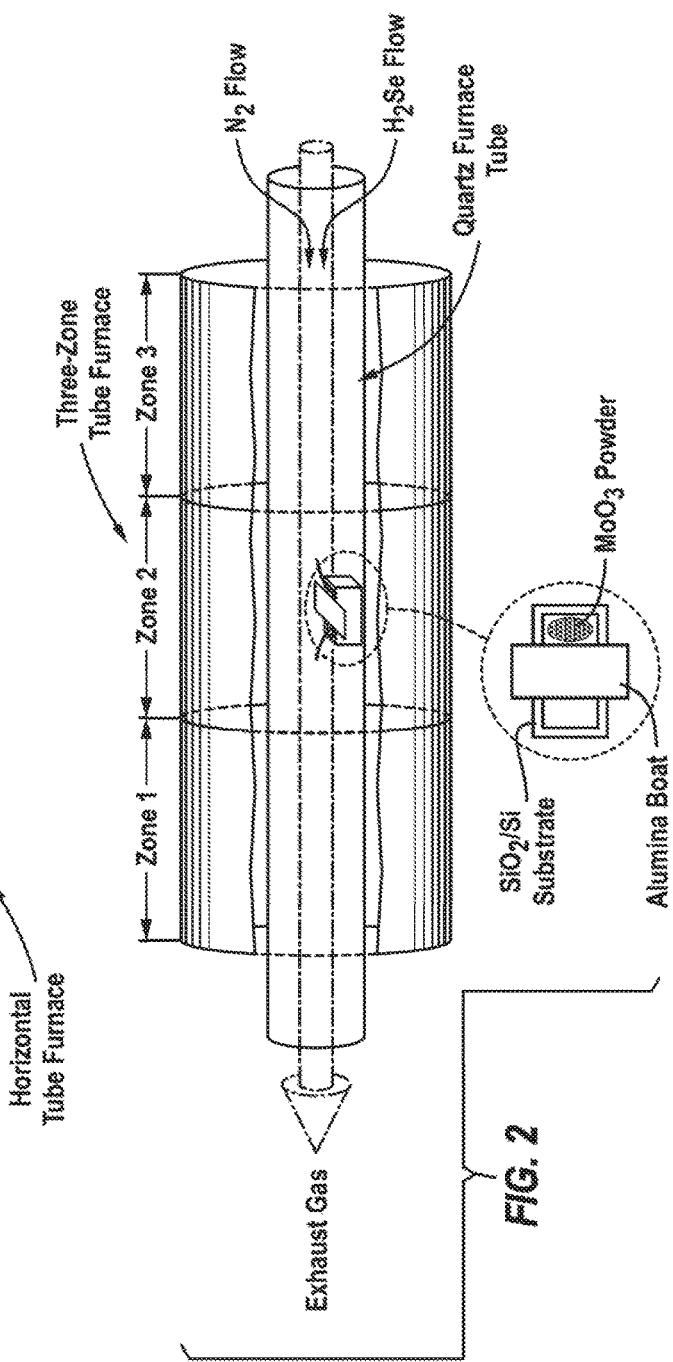
FIG. 2 is a schematic diagram illustrating the synthesis of $MoSe_2$ monolayers using $H_2Se$ gas according to an embodiment of the invention.
Figure 3:
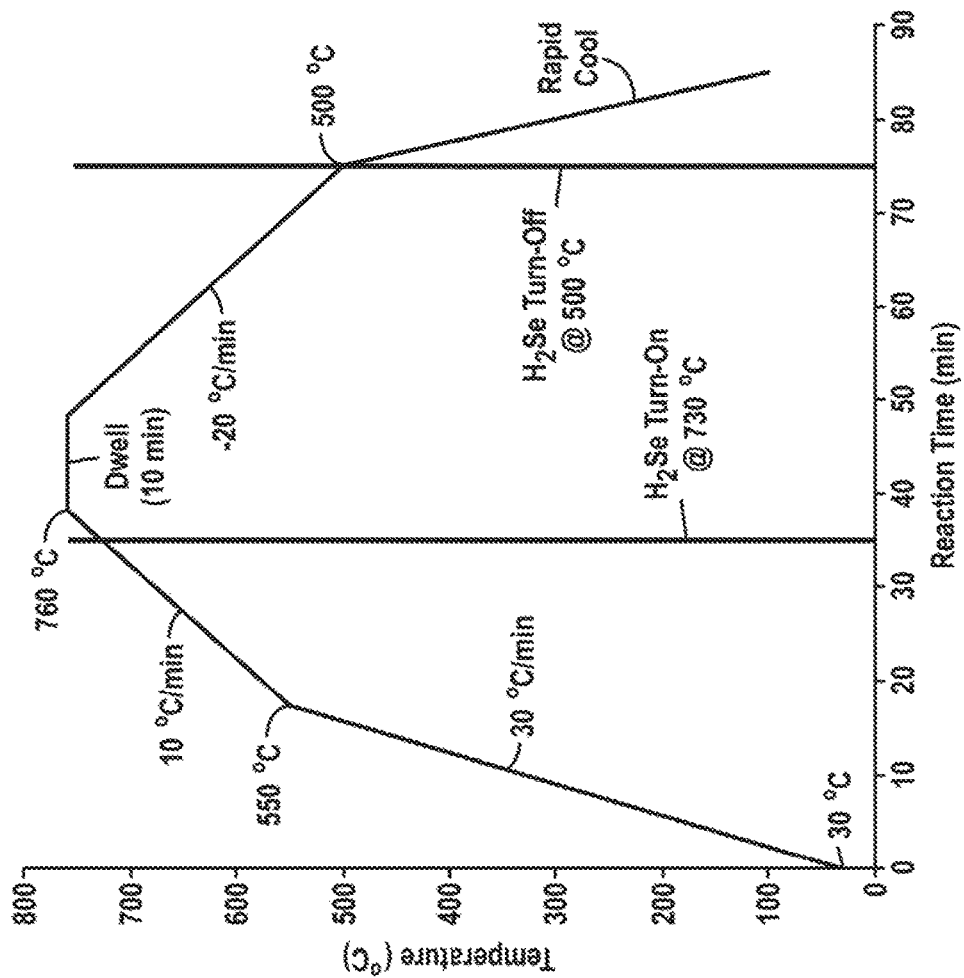
FIG. 3 is a tube furnace temperature profile for the synthesis of $MoSe_2$ monolayers using $H_2Se$ gas according to an embodiment of the invention.

The reaction set-up is illustrated in FIG. 2. $MoO_3$ powder (10 mg) was placed in an alumina boat. A pre-cleaned $SiO_2$/Si substrate was placed face-down on top of the boat. The boat was loaded into the center of a quartz reaction tube. The assembled reaction tube was placed within a tube furnace and connected to $N_2$ and $H_2Se$ reaction gas lines, which were controlled by mass flow controllers, and exhaust lines. Prior to reaction, the tube was purged with vacuum/$N_2$ cycles, before re-filling the chamber with $N_2$ gas and maintaining the carrier gas flow at 90 sccm. The tube furnace was turned on, and followed the pre-programmed temperature profile shown in FIG. 3. When the furnace reached 730° C., $H_2Se$ was introduced at a rate of 10 sccm.

Figure 4:
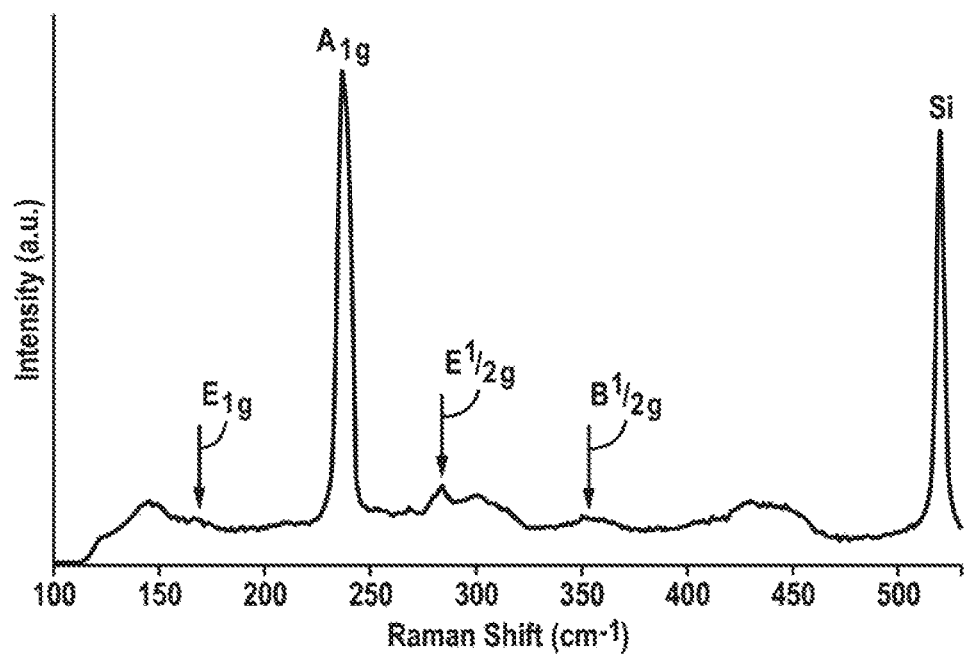
FIG. 4 is a Raman spectrum of $MoSe_2$ monolayers grown using $H_2Se$ gas.

The reaction resulted in the growth of $MoSe_2$ nanosheets on the $SiO_2$/Si substrate. The lateral dimensions of the nanosheets ranged from sub-micron to 20 μm. The formation of monolayer $MoSe_2$ was supported by Raman spectroscopy (FIG. 4), with the position of the $A_{1g}$ band matching well with that reported for $MoSe_2$ monolayers in the literature [J. C. Shaw, H. Zhou, Y. Chen, N. O. Weiss, Y. Liu, Y. Huang and X. Duan, *Nano Res.*, 2014, 7, 511] and lack of definition of the $B^1_{2g}$ band.

These and other advantages of the present invention will be apparent to those skilled in the art from the foregoing specification. Accordingly, it is to be recognized by those skilled in the art that changes or modifications may be made to the above-described embodiments without departing from the broad inventive concepts of the invention. It is to be understood that this invention is not limited to the particular embodiments described herein and that various changes and modifications may be made without departing from the scope of the present invention as literally and equivalently covered by the following claims.

What is claimed is:

1. A method of synthesizing a metal chalcogenide nanosheet comprising:
   placing a solid metal precursor in a receptacle;
   placing the solid-metal precursor-containing receptacle in a reaction chamber;
   transmitting a gaseous selenium precursor through the reaction chamber;
   reacting the gaseous selenium precursor with the metal precursor; and
   forming the metal chalcogenide nanosheet on a substrate, the substrate being independent of the receptacle.

2. The method of claim 1, wherein the metal chalcogenide nanosheet is selected from the group consisting of: $WSe_2$; $MoSe_2$; $NbSe_2$; $PtSe_2$; $ReSe_2$; $TaSe_2$; $TiSe_2$; $ZrSe_2$; $ScSe_2$; $VSe_2$; GaSe; $Ga_2Se_3$; $Bi_2Se_3$; GeSe; InSe; $In_2Se_3$; $SnSe_2$; SnSe; $SbSe_3$; $ZrSe_3$; $MnIn_2Se_4$; $MgIn_2Se_4$; $Pb_2Bi_2Se_5$; $SnPSe_3$; and PdPSe; and alloys and doped derivatives thereof.

3. The method of claim 1, wherein the metal precursor is selected from the group consisting of: a metal; a metal diselenide bulk powder; a metal oxide; an inorganic precursor; an organometallic precursor; a metal alkyl precursor; an ethylhexanoate salt; and bis(ethylbenzene)molybdenum.

4. The method of claim 1, wherein the gaseous selenium precursor is selected from the group consisting of: $H_2Se$; an alkyl selenide; and an aryl selenide.

5. The method of claim 1, further comprising reacting the gaseous selenium precursor with the metal precursor in the presence of a reducing gas.

6. The method of claim 1, further comprising reacting the gaseous selenium precursor with the metal precursor in the presence of $H_2S$.

7. The method of claim 1, wherein the gaseous selenium precursor is mixed with a ligand.

8. The method of claim 7, wherein the ligand is selected from the group consisting of: an alkane thiol; an alkane selenol; and a combination of an alkane thiol and an alkane selenol.

9. The method of claim 1, wherein the reaction chamber is a chemical vapor deposition reactor.

10. The method of claim 1, further comprising reacting the gaseous selenium precursor and the metal precursor at a temperature, or a range of temperatures, between 100° C. and 550° C.

11. The method of claim 1, further comprising reacting the gaseous selenium precursor and the metal precursor at a temperature, or a range of temperatures, above 550° C.

12. The method of claim 1, further comprising reacting the gaseous selenium precursor and the metal precursor in the presence of an inert carrier gas.

13. The method of claim 1, wherein the nanosheet has lateral dimensions less than 10 nm.

14. The method of claim 1, wherein the nanosheet has lateral dimensions between 10 nm and 100 μm.

15. The method of claim 1, wherein the nanosheet has lateral dimensions greater than 100 μm.

16. The method of claim 1, wherein reacting the gaseous selenium precursor with the metal precursor is conducted at a pressure below atmospheric pressure.

17. The method of claim 1, wherein reacting the gaseous selenium precursor with the metal precursor is conducted at atmospheric pressure.

18. The method of claim 1, wherein reacting the gaseous selenium precursor with the metal precursor is conducted at a pressure above atmospheric pressure.

* * * * *